United States Patent [19]

Willemsen et al.

[11] Patent Number: 5,205,353
[45] Date of Patent: Apr. 27, 1993

[54] HEAT EXCHANGING MEMBER

[75] Inventors: Henricus P. Willemsen, Aarle-Rixtel; Carolina A. M. C. Dirix, Westervoort; Theodorus G. J. Te Boekhorst, Zevenaar, all of Netherlands

[73] Assignee: Akzo N.V., Arnhem, Netherlands

[21] Appl. No.: 837,504

[22] Filed: Feb. 18, 1992

Related U.S. Application Data

[63] Continuation-in-part of Ser. No. 788,057, Nov. 5, 1991, which is a continuation of Ser. No. 444,085, Nov. 30, 1989, abandoned.

[30] Foreign Application Priority Data

Feb. 20, 1991 [NL] Netherlands ............... 9100296

[51] Int. Cl.$^5$ ............................................. F28F 3/12
[52] U.S. Cl. ................................ 165/170; 165/185; 165/907
[58] Field of Search .................. 165/170, 185, 907

[56] References Cited

U.S. PATENT DOCUMENTS

| | | | |
|---|---|---|---|
| 3,302,704 | 2/1967 | Valvi | 165/170 |
| 4,446,851 | 5/1984 | Grose | 186/449 |
| 4,531,145 | 7/1985 | Wiech, Jr. | 357/81 |
| 4,777,560 | 10/1988 | Herrell et al. | 361/384 |
| 4,843,693 | 7/1989 | Chisholm | 29/157.3 R |
| 4,884,631 | 12/1989 | Rippel | 165/185 |
| 4,896,719 | 1/1990 | O'Neill et al. | 165/170 |
| 4,898,234 | 2/1990 | McGovern et al. | 165/170 |
| 5,005,640 | 4/1991 | Lapinski et al. | 165/170 |

FOREIGN PATENT DOCUMENTS

| | | |
|---|---|---|
| 1238428 | 6/1988 | Canada . |
| 174537 | 3/1986 | European Pat. Off. . |
| 194358 | 9/1986 | European Pat. Off. . |
| 237741 | 9/1987 | European Pat. Off. . |
| 376365 | 7/1990 | European Pat. Off. . |
| 413498 | 2/1991 | European Pat. Off. . |
| 60-0294 | 1/1985 | Japan ................ 165/907 |

OTHER PUBLICATIONS

Electronic Packaging & Production, Oct. 30, 1990, No. 10, p. 47.

Primary Examiner—Allen J. Flanigan
Attorney, Agent, or Firm—Richard P. Fennelly; Louis A. Morris

[57] ABSTRACT

A heat exchanging member, more particularly for cooling a semiconductor module, having at a first and a second side, respectively, inlets and outlets, respectively, for a preferably gaseous heat exchanging medium, and having a heat exchanging component made of a highly thermal conductive material, such as metal, in which channels disposed side by side and running from its inlet side to its outlet side have been formed, such that medium flowing in through the inlet channels is constrained to flow at an angle to the direction of entry via the heat exchanging material to the adjacent outlet channels, characterized in that the heat exchanging material has a structure which comprises packed parts including:

a) randomly packed elementary parts, such as grains, fibers or scales, or b) parts packed in an ordered fashion, such as gauze or plates, with the exception of individual wires.

In a preferred embodiment the heat exchanging material is made up of sintering bronze.

10 Claims, 3 Drawing Sheets

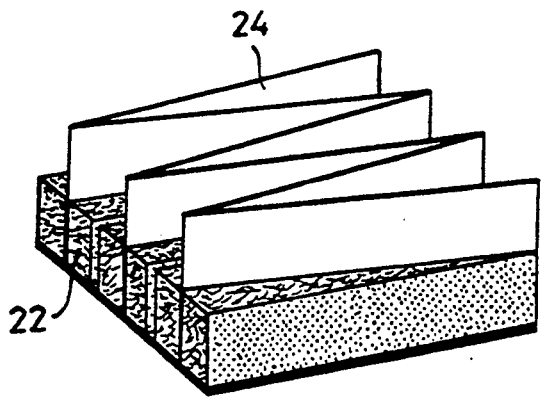
FIG: 4a.
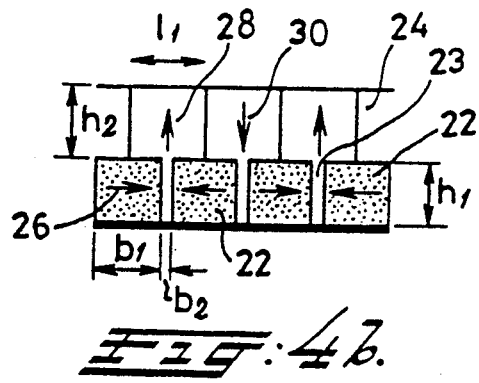
FIG: 4b.
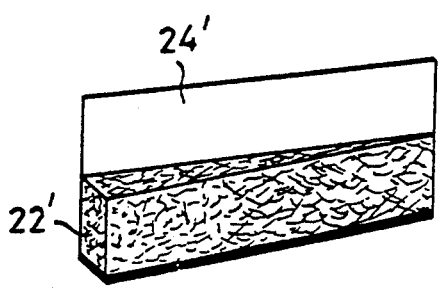
FIG: 5a.
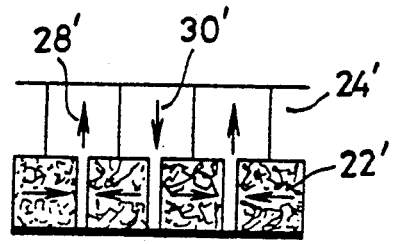
FIG: 5b.
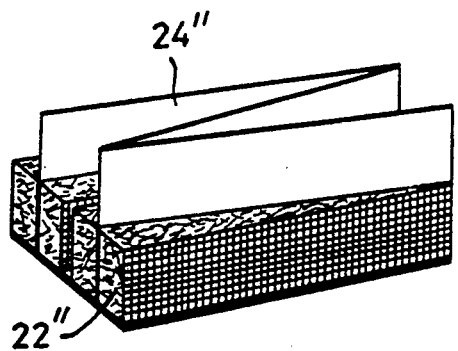
FIG: 6.
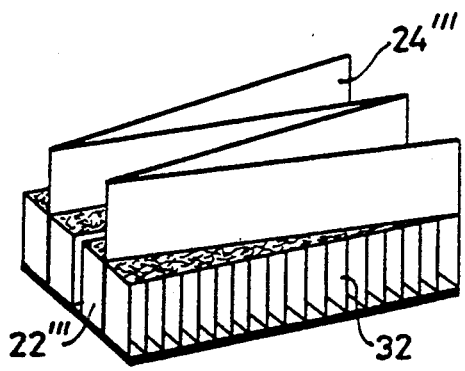
FIG: 7a.
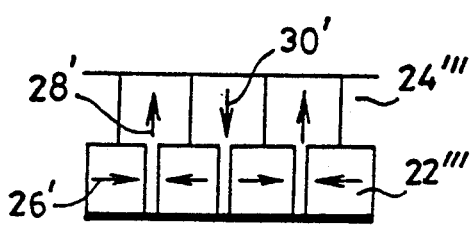
FIG: 7b.

HEAT EXCHANGING MEMBER

This is a continuation-in-part of U.S. Ser. No. 788,057, filed Nov. 5, 1991, which was a continuation of U.S. Ser. No. 444,085, filed Nov. 30, 1989, now abandoned.

BACKGROUND OF THE INVENTION

The invention relates to a heat exchanging member for, preferably, cooling a semiconductor module, having at a first and a second side, respectively, inlets and outlets, respectively, for a gaseous or a liquid heat exchanging medium, and having a heat exchanging component made of a highly thermal conductive material, such as metal, in which channels disposed side by side and running from its inlet side to its outlet side have been formed, such that medium flowing in through the inlet channels is constrained to flow at an angle to the direction of entry of the heat exchanging material to the adjacent outlet channels.

Such a general type of heat exchanging member is known from European Patent Publication No. 376,365. In this known member the heat exchanging component is built up of rows of thin wire members, which rows are of triangular cross-section. This gives an especially large heat dissipating surface area, resulting in a particularly high performance, because of the special way in which the gaseous heat exchanging medium is constrained to flow. However, this known construction is comparatively difficult to make and less suited to mass manufacturing. The present invention envisages providing a heat exchanging member, of the general type described above, which is free of these drawbacks and yet has a performance which almost matches that of the known heat exchanging member. Canadian Patent No. 1,238,428 describes a different type of heat sink for a semiconductor module, one which contains thin cooling fins in the form of protrusions composed of multiple fused thermal conductive spheroids. European Patent Publication No. 174,537 describes another type of cooling member for a semiconductor module, one which may be composed of copper fibers having an elastic felt structure. European Patent Publication No. 237,741 describes yet another type of device for cooling electronic components in which are provided a porous layer composed of sintered ultrafine grains and microscopic liquid-filled cavities which are positioned between a heat generating element and a heat sink element. U.S. Pat. No. 4,884,631 describes yet another heat sink apparatus for semiconductors in which a flow of cooling air is forced through various structural material configurations, such as honeycomb, corrugated, or serpentine. Reference is also made to U.S. Pat. No. 4,843,693 and to "Serpentine Copper Mesh Forms Heat Sinks," *Electronic Packaging and Production* (Newton, Mass., U.S.A.), Vol. 30., No. 10 (October 1990), p. 47 for additional teachings in the art regarding the use of corrugated copper mesh in a heat exchanger for electronic components. U.S. Pat. No. 4,531,145 describes another type of apparatus which comprises a substrate of sintered aluminum oxide to which chips are attached and with channels for a coolant provided therein. European Patent Publication No. 413,498 describes a different type of cooling element for electronic components which uses flat wire mesh packages for heat exchanging. European Patent Publication No. 194,358 describes another type of heat sink for electronic components which comprises a body made of specially sintered boron nitride with cooling fins.

DESCRIPTION OF THE PRESENT INVENTION

According to the present invention the object is attained because the heat exchanging material comprises packed parts. It has a structure which a) is composed of randomly packed elementary parts, such as grains, fibers or scales, or b) is composed of parts packed in an ordered fashion, such as gauze or plates, except for individual wires.

Such a structure is easily manufactured in any desired configuration and has a very large heat exchanging surface area at a comparatively low flow resistance. According to the invention the construction advantageously is such that at least 50 wt. %, preferably 50–100 wt. % of the grains or the fibers have a diameter of at most 10 $\mu$m to 2000 $\mu$m, at least 50 wt. %, preferably 50–100 wt. % of the, preferably slightly curved, scales and the plates have a thickness of at most 10 $\mu$m to 2000 $\mu$m, and at least 50 wt. %, preferably 50–100 wt. % of the, preferably copper, gauze has a mesh size of at most 10 $\mu$m to 2000 $\mu$m.

The heat exchanging member according to the invention is further characterized by at least 50 wt. %, preferably 50–100 wt. % of the randomly packed elementary parts or the parts packed in an ordered fashion have a characteristic diameter of at most 10 $\mu$m to 2000 $\mu$m. A preferred embodiment of the heat exchanging member according to the invention is characterized by the randomly packed elementary parts or the parts packed in an ordered fashion have a characteristic diameter of at most 10 $\mu$m to 2000 $\mu$m, preferably 50 $\mu$m to 1000 $\mu$m. Especially favorable results can be obtained when the heat exchanging member according to the invention is characterized by the randomly packed elementary parts or the parts packed in an ordered fashion have a characteristic diameter of virtually equal magnitude. In other words, when said parts are in the form of grains, these grains will, according to the invention, preferably be of about the same magnitude.

By "said characteristic diameter of said randomly packed elementary parts or said parts packed in an ordered fashion" is meant the diameter in the case of, by and large, three-dimensional and one-dimensional parts, such as grains or fibers, the thickness in the case of, by and large, two-dimensional parts, such as scales, or the mesh size in the case of gauze.

Preferably, in such a case, the heat exchanging component is made of sintering metal, more particularly of sintering bronze. In a preferred embodiment, the heat exchanging component and the channels present in it have been made as one, with the bottom of the inlet and outlet channels being positioned at some distance from the component's under-face. In a favorable preferred embodiment, the inlet and outlet channels have been constructed as straight, mutually parallel channels in the heat exchanging component, which is closed at its upper- and under-faces, and on the upper-face of which have been disposed, inclined at an acute angle to each other and covered by a covering plate, elongated medium-guiding plates, each running from the end of an outlet channel on the inlet side to the end of an adjacent inlet channel on the outlet side. The distance between the medium-guiding plates at the inlet side preferably equals this distance at the outlet side and is in the range of 0.5–20 mm, preferably in the range of 2–10 mm, and the width of each channel preferably equals 0.1–0.5 times the width of such a channel augmented by the width of a strip of heat exchanging material as defined by two adjacent channels.

In an especially favorable process for the manufacture of the heat exchanging member according to the invention granular material is compressed and sintered to form a structure consisting of ribs separated by grooves, whereupon the ribs are shortened by being cut at some distance from their tops to obtain a heat exchanging component. So, according to this process the heat, exchanging material is manufactured in greater lengths, and sections of this semi-manufactured product are removed and then combined with an extension piece, also pre-manufactured as a semi-product by plastics molding and comprising the guiding plates and a covering plate. In this manner particularly simple and inexpensive manufacture is made possible, thus permitting simple and rapid adjustment to the configuration of a specific semiconductor module.

The invention will be illustrated with reference to the Drawings:

FIG. 4a is a schematic perspective view, partially cut away, of a construction in which the heat exchanging material is a sintering metal.

FIG. 4b is a front view of this embodiment.

FIGS. 5a and 5b are similar views to those of FIGS. 4a and 4b of an embodiment in which the heat exchanging material comprises metal fibers.

FIGS. 7a and 7b are views corresponding to FIGS. 4a and 4b of an embodiment in which the heat exchanging material has a fin-shaped configuration made up of plates.

FIG. 8 is a front view of part of a semi-manufactured product from which the heat exchanging components according to the invention can be made.

Figure 1:
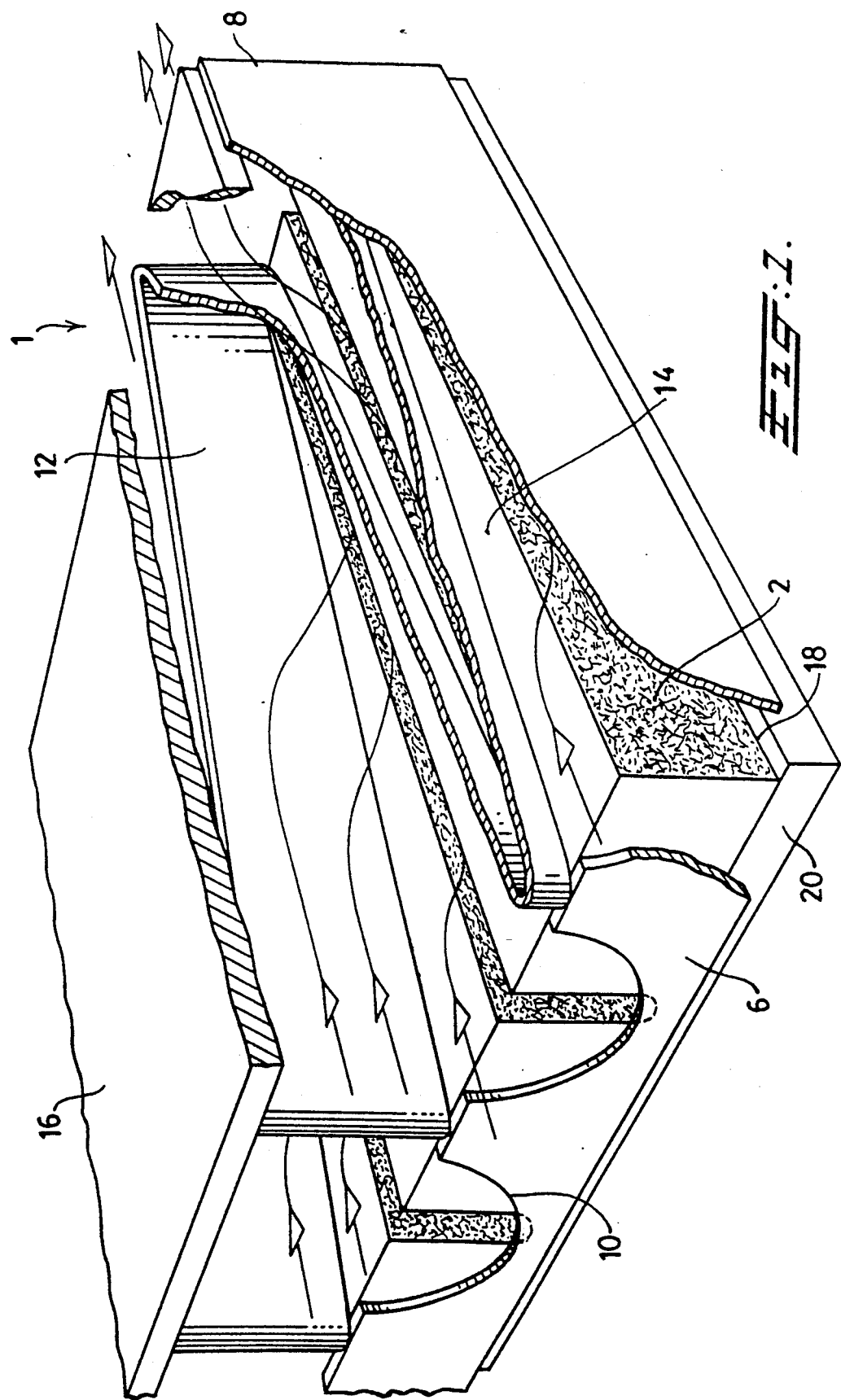
FIG. 1 is a perspective view, partially cut away, of part of a heat exchanging member according to the invention.
Figure 2:
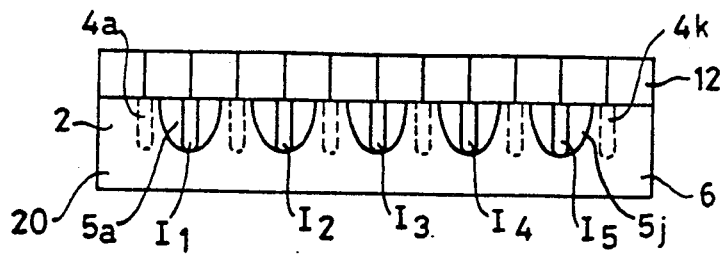
FIG. 2 is a front view of this embodiment.
Figure 3:
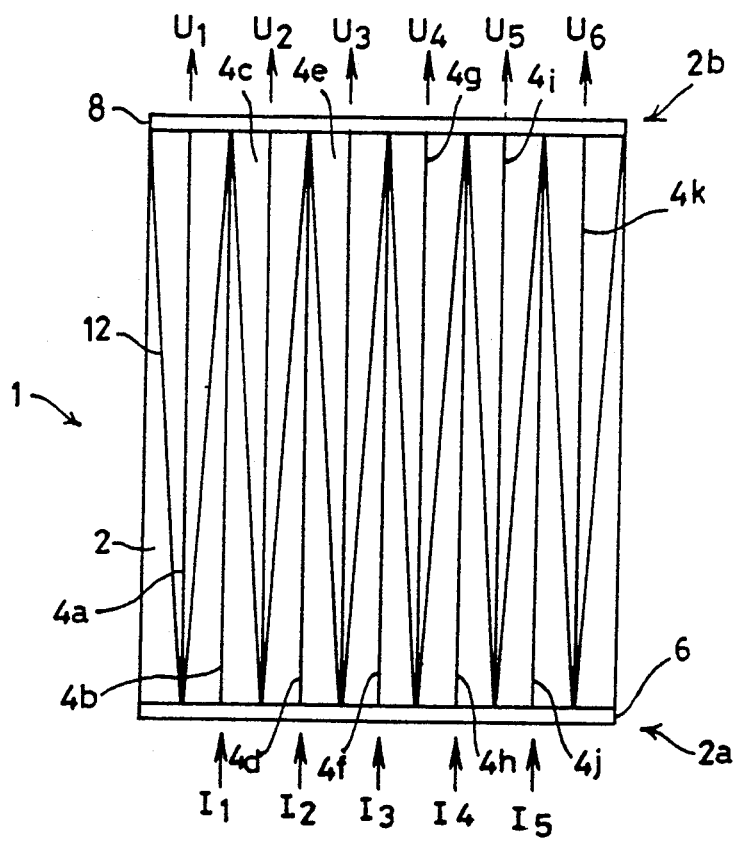
FIG. 3 is a schematic top view of such an embodiment.

The heat exchanging member 1 depicted in FIGS. 1-3 comprises a heat exchanging component 2, which has a structure composed of packed discrete granular particles, their largest dimension being in the range of 100 μm to 1000 μm. In between these particles there are interspaces through which a gaseous medium, more particularly air can flow. A highly suitable material for use in this heat exchanging component is sintered bronze.

In the heat exchanging component there are a number of mutually parallel grooves 4, which are indicated in FIG. 3 with numerals 4a through 4k. The heat exchanging component 2 has an inlet side 2a where the heat exchanging medium is fed and an outlet side 2b where it is discharged; the grooves 4b, 4d, 4f, 4h, and 4j form the inlet channels $I_1$ through $I_5$, while the grooves 4a, 4c, 4e, 4g, 4i, and 4k form the outlet channels $U_1$ through $U_6$. So, between the grooves 4a through 4k there are strips of heat exchanging material 5a through 5j through which the heat exchanging medium flows. The inlet channels $I_1$ through $I_5$ each are closed at the outlet end 2b and the outlet channels $U_1$ through $U_6$ are closed at the inlet end 2a. For this purpose a plate 6 provided with appropriate recesses has been provided at the inlet end 2a and a similar plate 8 at the outlet end 2b.

Guiding plates 12, each running from the end of an outlet channel situated at the inlet side 2a to the end of an inlet channel situated at the outlet side 2b, provide extra guiding to the cooling medium, which, due to the fact that the heat exchanging component 2 is closed at the upper face 14, can only flow through the heat exchanging material along the vertical walls of the grooves. A covering plate 16 completes the heat exchanging member, of which the bottom 18 is mounted in an appropriate manner on a base 20, which is in thermal conductive contact with the strips 5a through 5j; such a base may for instance take the form of a semiconductor module which has to be cooled. In the resulting member the heat exchanging medium fed via the inlet recesses 10 in the plate 6 will be constrained to flow via the inlet grooves and through the strips of heat exchanging material 5a through 5j to the outlet grooves forming the outlet channels, such as is indicated in FIG. 4b.

Figure 6:
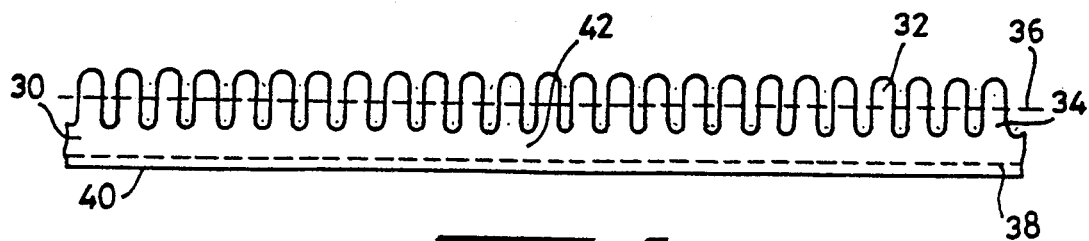
FIG. 6 is a view corresponding to FIG. 5a of an embodiment in which use is also made of a gauze-like material.

FIGS. 4a, 4b; 5a, 5b; 6, and 7a, 7b are views of different strips of heat exchanging material, indicated with 22, consist of sintered grains, fibers, or irregularly shaped particles. The direction of flow of the medium through the heat exchanging material 22 and the guiding plates 24 is indicated with the arrows 26, 28, and 30. The same numerals with single prime are used to indicate corresponding parts in the FIGS. 5a and 5b relating to an embodiment in which the strips of heat exchanging material 22' are composed of metal fibers or randomly packed gauze. FIG. 6 relates to an embodiment in which the strips of heat exchanging material 22" are composed of stacked layers of gauze. Finally, FIGS. 7a, 7b relate to an embodiment in which the strips of heat exchanging material 22''' are composed of fins 32 arranged adjacently. Preferably, the characteristic dimension or diameter of the elementary material of which the heat exchanging structure used is built up is 100–1000 μm, and for the different dimensions indicated only in FIG. 4b the values described below may be used.

Distance 11 between the guiding plates 24 at the inlet and outlet sides, respectively (which may also be referred to as the "zigzag pitch") can be in the range of 0.5 to 20 mm, preferably in the range of 2 to 10 mm. This distance is equal to the width b1 of a strip 22 plus the width b2 of a groove 23 separating the strips. This width b2 is preferably in the range of 0.1 to 0.5 times the value (b1+b2).

The high cooling performance to be obtained is illustrated by the fact that, using a heat exchanging member with a configuration as depicted in FIGS. 1-4b and having the following parameters:

```
length × width = 100 × 100 mm
number of sintering components (5a to 4j, or 22) = 25
width (b1) of sintering component = 3 mm
height (h1) of sintering component = 4 mm
width (b2) of grooves (4a to 4h or 23) = 1 mm
height of guiding plates (h2) = 6 mm
air throughput = 10 l/sec
temperature difference between incoming
air and base plate = 50° K.
average grain diameter = 500 μm;
``` it is possible to dissipate 500 W of power.

The invention further proposes a particularly simple process for the manufacturing such a heat exchanging means. To this end, bronze grains are sintered to form a semi-manufactured product 30 having a cross-section as indicated in FIG. 8. By sawing off the top end sections 32 of the formed ribs 34 along the line 36, the configuration according to FIG. 2 is obtained. The advantage of this process is that the top area of the ribs has already been "stopped" and, therefore, no further sealing is required. A corresponding process is carried out along the line 38 at a short distance from the under-face 40 of the semi-manufactured product 30, so that also here a sealed bottom area is obtained. Next, the semi-manufactured product is split up along the transverse lines 42 to give the desired width and shortened to the desired length, after which the heat exchanging component obtained in the FIGS. 2 and 3 has been actualized.

Within the framework of the invention various changes can be made. In addition to cooling semiconductor modules the heat exchanger according to the invention can advantageously be employed in the cooling of rotary or linear high performance engines, lasers, power, supplies (power bricks), power electronics, an output amplifier in a high-powered amplifier. In addition to being of sintering bronze the heat exchanging component may advantageously be of other highly thermal conducting metals or metal alloys, such as aluminum or aluminum alloys. Instead of employing grains of metal for the heat exchanging component it is also possible to make use of diamond grains or metallized grains of organic material. According to the invention use may with advantage be made of a liquid cooling medium, more particularly water, as well as a gaseous one.

By the diameter of the grains composed of, say, sintering metal is meant the largest transverse dimension of said grains.

We claim:

1. A heat exchanging member having at a first and a second side, respectively, inlets and outlets, respectively, for a heat exchanging medium, and having a heat exchanging component made of a highly thermal conductive material in which channels disposed side by side and running from its inlet side to its outlet side have been formed, such that medium flowing in through the inlet channels is constrained to flow at an angle to the direction of entry via the heat exchanging material to the adjacent outlet channels, characterized in that the heat exchanging material comprises packed parts.

2. A heat exchanging member as claimed in claim 1 wherein the packed parts are randomly packed elementary parts.

3. A heat exchanging member according to claim 1, characterized in that at least 50 wt. % of the packed parts have a characteristic diameter of at most 10 $\mu$m to 2000 $\mu$m.

4. A heat exchanging member according to claim 3, characterized in that 50–100 wt. % of the packed parts have a characteristic diameter of at most 10 $\mu$m to 2000 $\mu$m.

5. A heat exchanging member according to claim 1, characterized in that the packed parts have a characteristic diameter of substantially equal magnitude.

6. A heat exchanging member according to claim 1, characterized in that the heat exchanging material is made of sintering metal, such as sintering bronze.

7. A heat exchanging member according to claim 6, characterized in that the heat exchanging material and the channels present in it have been made as one.

8. A heat exchanging member according to claim 1, characterized in that the inlet and outlet channels have been constructed as straight, mutually parallel channels in the heat exchanging member, which is closed at its upper- and under-faces, and on the upper-face of which have been disposed, inclined at an acute angle to each other and covered by a covering plate, elongated medium-guiding plates, each running from the end of an outlet channel on the inlet side to the end of an adjacent inlet channel on the outlet side.

9. A heat exchanging medium according to claim 8, characterized in that, the distance between the medium-guiding plates at the inlet side equals this distance at the outlet side and is in the range of 0.5–20 mm.

10. A heat exchanging member according to claim 8, characterized in that the width of each channel equals 0.1–0.5 times the width of such a channel augmented by the width of a strip of heat exchanging material as defined by two adjacent channels.

* * * * *